(12) United States Patent
Mizusawa

(10) Patent No.: US 7,500,117 B2
(45) Date of Patent: Mar. 3, 2009

(54) RADIO COMMUNICATION TERMINAL

(75) Inventor: Nishiki Mizusawa, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 493 days.

(21) Appl. No.: 11/219,266

(22) Filed: Sep. 2, 2005

(65) Prior Publication Data

US 2006/0053321 A1 Mar. 9, 2006

(30) Foreign Application Priority Data

Sep. 3, 2004 (JP) .......................... P2004-257340

(51) Int. Cl.
*G06F 1/00* (2006.01)
*G06F 1/26* (2006.01)
*G06F 1/32* (2006.01)
*G06F 11/30* (2006.01)

(52) U.S. Cl. .................... 713/300; 713/320; 713/340

(58) Field of Classification Search .................. 713/300
See application file for complete search history.

(56) References Cited

U.S. PATENT DOCUMENTS

| | | | | |
|---|---|---|---|---|
| 6,047,380 A | * | 4/2000 | Nolan et al. | ................ 713/324 |
| 7,120,803 B2 | * | 10/2006 | Tanaka | ........................ 713/300 |
| 2003/0104849 A1 | * | 6/2003 | Arimitsu | ..................... 455/574 |
| 2004/0208260 A1 | * | 10/2004 | Chan et al. | .................. 375/297 |
| 2006/0059379 A1 | * | 3/2006 | Tanaka | ........................ 713/300 |

FOREIGN PATENT DOCUMENTS

| | | |
|---|---|---|
| JP | 57 60739 | 4/1982 |
| JP | 11 251930 | 9/1999 |
| JP | 2001-217661 | 8/2001 |
| JP | 2004 235721 | 8/2004 |

\* cited by examiner

*Primary Examiner*—Thomas Lee
*Assistant Examiner*—Michael J Brown
(74) *Attorney, Agent, or Firm*—Frommer Lawrence & Haug LLP; William S. Frommer; Ellen Marcie Emas

(57) ABSTRACT

A radio communication terminal has a plurality of matching circuits that optimize the efficiency of a power amplifier for a range of different battery voltages. A first matching circuit optimizes the efficiency of the power amplifier for a battery voltage higher than a predetermined threshold value. A second matching circuit optimizes the efficiency of the power amplifier at a voltage lower than the threshold value. A control section compares a detection result of a battery voltage from a voltage monitor section with the threshold value, and performs switching between the plurality of matching circuits.

12 Claims, 14 Drawing Sheets

RADIO COMMUNICATION TERMINAL

CROSS REFERENCES TO RELATED APPLICATIONS

The present invention contains subject matter related to Japanese Patent Application JP 2004-257340 filed in the Japanese Patent Office on Sep. 3, 2004, the entire contents of which being incorporated herein by reference.

BACKGROUND OF THE INVENTION

1. Field of the Invention

The present invention relates to a radio communication terminal to be operated by a battery, and more specifically to a radio communication terminal capable of increasing a usable time of the terminal.

2. Description of the Related Art

In recent years, cellular phone terminals (each of which hereinbelow will be alternatively referred to as a "terminal") contain a variety of applications, so that while various ways of usage are made possible, the usable time thereof is required to be increased as long as possible. Such terminals operate with a secondary battery working as a power source, so that the following three points are important to increase the usable time of the terminal: enhancement of the battery capacity, lowering of the end voltage, and enhancement of the efficiency of a terminal circuit.

(End Voltage)

A terminal of the type described above contains a power amplifier to generate transmission power for a base station. During a communication event, power consumption of the power amplifier is dominant, so that efficiency enhancement of the power amplifier is important to enhance an actual-usage communication time (i.e., battery life). Generally, the battery voltage is used as it is for a power source of the power amplifier in the case of the maximum transmission power.

On the other hand, most circuits other than the power amplifier of the terminal are configured of CMOS integrated circuits. The power supply voltage required for the circuits is sufficiently low in comparison to the battery voltage, so that the power supply voltage is supplied after having been converted to a low voltage by, for example, a DC/DC converter or series regulator. For some portions, particularly, a display section or the like requiring high voltage, a step-up DC/DC converter, for example, is used.

The operable voltage of the terminal is determined by a voltage range wherein the power amplifier is operable, so that a lower limit voltage ("end voltage," hereafter) at which the power amplifier is operable is important.

A circuit of a power amplifier used in a previous terminal is optimized to exhibit high efficiency at about 3.5 V that is an average discharge voltage of lithium ion secondary battery. In this case, the end voltage is set to a range of from about 3.3 V to about 3.2 V, which is a lower-limit power source voltage enabling satisfying wireless or radio characteristics standards of the terminal by using the power amplifier.

A continual wait time of a terminal is determined by a time necessary for the battery voltage to reach the end voltage in the receiving operation. A continual communication time of the terminal is determined by a time necessary for the battery voltage to reach the end voltage in a predetermined communication state (transmit or receive operation). However, a threshold value to be practically used is different depending on the operation state, as described below.

(Operation at End Voltage)

According to the previous terminal, in the event a single type of the end voltage is stored, when the battery voltage reaches the end voltage, if the state is a communication state, a communication termination process according to a protocol is performed. For example, the termination process for saving data and the like of the terminal, and then the power source is turned OFF. The single type of the end voltage indicates that one type of a threshold is used for a battery voltage that is to be detected in the state where the value power amplifier is operating.

However, a battery voltage being detected is such that, due to influences of, for example, internal resistances of the battery and wiring resistances inside of the terminal, the current flowing to internal resistors and the voltage drop level are different depending on the operation state (during wait operation, communication, or activation of a respective application, for example). This causes a problem for performing the detection of the battery voltage at all times by using a constant threshold value. As such, a certain number of threshold values are provided and compared corresponding to the operation state, thereby to select a single end voltage.

(Capacity Enhancement of Battery and Voltage Reduction of End Voltage)

FIG. 1 shows example discharge load characteristics of a lithium ion secondary battery. As can be seen from the drawing, the battery voltage slowly decreases as discharge proceeds, and sharply decreases at a certain point.

In recent years, since a cellular terminal contains a variety of applications, the terminal is required to have enhanced in, for example, capacity or capacity density, and development for new electrodes is now in progress. However, as shown in FIG. 2, according to the discharge load characteristics of a large-capacity battery, the drop of the battery voltage tends to increase as discharging increases. As such, to efficiently use features of the large capacity battery, it is necessary to reduce the end voltage of the terminal and to improve the circuit power efficiency in a wide range with respect to fluctuations in the battery voltage.

(Efficiency Enhancement of Circuits of Terminal)

FIG. 3 shows a configuration example of a transmit section of the previous terminal.

An antenna 1 is a component that performs transmission or reception of radio waves. A duplexer 4 is a component that separates transmission waves and reception waves that are different in frequency from one another, thereby to enable transmission and reception to be synchronously performed through the antenna 1. A band pass filter 6 is a component that removes unnecessary out-of-band noise from a transmission modulation wave, thereby to pass the transmission wave to a power amplifier 2. The voltage of a battery 3 is supplied to a power source of the power amplifier 2 through a switch 5. The switch 5 is controlled to ON only for effecting transmission, but is controlled to OFF in, for example, a power OFF time and reception-wait time of the terminal, thereby to prevent the battery from being unnecessarily consumed due to leak current. For the switch 5, a p-channel MOSFET having an ON-resistance of several tens of megohms (mΩ), for example, is used, wherein when the power amplifier 2 outputs a maximum transmission power, a voltage drop of a several tens of millivolts (mV) occurs.

It is prerequisite that the power amplifier 2 operates all time with the voltage of a battery 3, FET (field effect transistor) sizes and matching circuits are optimized to improve the efficiency at an average discharge voltage of the battery under the maximum transmission power. Depending on the case, an isolator (not shown) is interposed between the duplexer 4 and the power amplifier 2. In a CDMA (code division multiple access) terminal, precise power control is performed for the power amplifiers.

FIG. 5 shows investigation results of output power distributions in urban areas, wherein the rate of using a transmission power exceeding 22 dBm is 0.2% or lower, and an average output is 3.5 mW (5.4 dBm).

For cellular phone terminals, although IS-95 of USA TIA standard specifications, ARIB STDT-53, and the like specify the transmission maximum power to be 200 mW, it is most likely to be 10 mW or less during a practical use time.

FIG. 4 is a configuration example of a transmit section used in a CDMA terminal. In the configuration, when, as described above, a power smaller than a power maximum transmission power is handled, a DC/DC converter 7 is used to enhance the efficiency by reducing the power supply voltage of a power amplifier 2. More specifically, the output voltage of the DC/DC converter 7 is varied corresponding to the transmission power, whereby high efficiency power amplification is implemented in a wide range of the transmission power.

In this case also, a largest possible power source voltage needs to be secured under the maximum transmission power. As such, a method is employed to cause the DC/DC converter 7 to produce an output voltage substantially the same as that of the battery. Alternatively, a switch 5 shown in FIG. 3 and the DC/DC converter 7 shown in FIG. 4 are parallel coupled together, wherein the switch 5 is turned ON only under the maximum transmission power.

By way of another previous example, Japanese Unexamined Patent Application Publication No. 2001-217661 discloses power amplifiers used in a CDMA terminal employing a scheme that uses a switch to switch the number of power amplifiers depending on the output power. In this case, as shown in FIG. 3, the battery voltage is directly used for the power source of the power amplifiers.

FIG. 6 shows a virtual load line (A-class virtual load line is shown to simplify the description) of the power amplifier. In this case, the tilt of the load line is Imax/(Vknee−Vmax), which corresponds to the reciprocal of a load resistance of a transistor.

A power Po that the transistor generates is $Po=(\frac{1}{8})(Vmax-Vknee)Imax$; and a DC input power Pdc is $Pdc=\{(Vmax+Vknee)Imax\}/4$.

A drain efficiency η is $\eta=Po/Pdc=(\frac{1}{2})*(Vmax-Vknee)/(Vmax+Vknee)$.

The above indicates that as the power source voltage is lower, the magnitude of the knee voltage (Vknee) becomes non-negligible to the extent of deteriorating the efficiency.

The above teaches that although the power source voltage of the power amplifier under the maximum transmission power can be reduced by increasing the tilt of the load line shown in FIG. 6, the efficiency practically attainable is deteriorated.

SUMMARY OF THE INVENTION

With the previous power amplifiers, as shown in FIGS. 3 and 4, high efficiency operation can be accomplished in the manner that the average discharge voltage of the previous secondary battery, as shown in FIGS. 1 and 2 is used for the power source voltage. This is attributed to the fact that the discharge characteristics of the respective previous secondary battery are relatively flat, and the voltage quickly drops at the discharge termination time.

In comparison, in the case the large-capacity secondary battery is used for the power source voltage of the previous power amplifier, the end voltage has to a half level of discharge of the battery, so that the battery cannot be used to the end, so that the usable time of the terminal cannot be made to be sufficiently long.

In addition, in the case that the power amplifier is designed to be optimized at a relatively small operation voltage, the efficiency under a high voltage in an initial discharge stage is low, but also the optimal value itself of the efficiency deteriorates. Consequently, even with the large-capacity secondary battery being used, the usable time of the terminal cannot be made to be sufficiently long.

The present invention is made on the background described above. Accordingly, it is desirous to maximize the usable time of a communication terminal by operating a power amplifier with high efficiency in a wide range of a power supply voltage when using a large capacity secondary battery causes significant fluctuations in the power supply voltage.

In one embodiment, a radio communication terminal according to the present invention includes a voltage monitor section that monitors a battery voltage; a power amplifier that outputs a desired power; a plurality of matching circuits that are disposed in a rear stage of the power amplifier and that optimizes an efficiency of the power amplifier for a range of different battery voltages; a switch for performing selection between the plurality of matching circuits; and a control section that makes comparison between a threshold value predetermined for switching between the plurality of matching circuits and a battery voltage detected by the voltage monitor section and that performs control of switching between the plurality of matching circuits.

The voltage monitor section monitors the battery voltage. The plurality of matching circuits optimize the efficiency of the power amplifier for the range of different battery voltages. The switch performs selection between the plurality of matching circuits. The power amplifier outputs the desired power through a selected one of the matching circuits. The control section makes comparison between the threshold value predetermined for switching between the plurality of matching circuits and the battery voltage detected by the voltage monitor section and that performs control of switching between the plurality of matching circuits. Thus, the battery voltage is monitored, and switching is performed between matching circuits for the power amplifier in correspondence to the magnitude of the battery voltage, whereby even in the configuration wherein a large-capacity secondary battery having significant power supply voltage fluctuations is used, the power amplifier can be operated at all times with high efficiency.

The plurality of matching circuits can include, for example, a first matching circuit that optimizes the efficiency of the power amplifier for a battery voltage higher than the threshold value; and a second matching circuit that optimizes the efficiency of the power amplifier at a voltage lower than the threshold value.

The above configuration may include a DC (direct current)/DC (direct current) converter that converts the battery voltage to a power supply voltage that is to be applied to the power amplifier, in accordance with a control signal; and a data table for generating control signals of the DC/DC converter in accordance with outputs of the voltage monitor section. In this configuration, the DC/DC converter can be controlled corresponding to the battery voltage, a power supply voltage corresponding to a transmission power that is to be output by the terminal can be applied to the power amplifier.

The power amplifier may include a first power amplifier and a second power amplifier that correspond to the first matching circuit and the second matching circuit, respectively; and the switch may perform switching between a set of the first amplifier and the first matching circuit and a set of the second amplifier and the second matching circuit. Since switching is performed to select the matching circuit and the power amplifier in the set, the design of the matching circuits is easy, and low loss performance can be attained.

In another embodiment, a radio communication terminal according to the present invention is operated by a battery and is operable in multiple bands (multi-bands). The radio communication terminal includes a voltage monitor section that monitors a battery voltage; a first power amplifier and a second power amplifier that correspond to a first radio band and a second radio band, respectively; a switch that selects one of the power amplifier corresponding to a desired one of the radio bands for supply of power to an antenna; and a control section that makes a comparison between a threshold value predetermined and the battery voltage, and performs control of the switch in accordance with a result of the comparison. The control section performs control so that the second power amplifier is selected when the battery voltage decreases below the threshold value.

Thus, the efficiencies of the respective power amplifiers are optimized for the different power supply voltages; and a radio band (power amplifier) exhibiting higher efficiency is selected from the first and second power amplifiers. Thereby, even in the configuration wherein a large-capacity secondary battery having significant power supply voltage fluctuations is used, the power amplifier can be operated at all times with high efficiency.

For example, the first power amplifier is optimized to be capable of outputting a maximum transmission power with high efficiency under a relatively high power source voltage in discharge voltage characteristics of the battery; and the second power amplifier is optimized to be capable of outputting the maximum transmission power with high efficiency under a relatively low power source voltage in the discharge voltage characteristics of the battery.

The configuration may be such that in the event that the battery voltage decreases below the threshold value, when the terminal is in a communication state, a predicted deterioration in reception quality in one of the radio bands is reported to a base station before operation of the one of the radio bands is terminated. In this case, upon reception of a request from the base station, the control section is able to perform switching to select to-be-used one of the radio bands and a corresponding one of the power amplifiers without causing discontinuation of communication.

According to the embodiment of the present invention, switching between the matching circuits is performed corresponding to the battery voltage. Thereby, the circuit efficiency can be enhanced in a wide range of battery discharge voltages, consequently enabling the usable time of the terminal to be increased. Accordingly, a large capacity secondary battery that exhibits a large voltage drop can be effectively utilized.

In addition, the power amplifiers having two end voltages are provided, and are switchably used corresponding to the battery voltage. Thereby, the circuit efficiency can be enhanced in the overall range of battery discharge voltages, consequently making it possible to increase the usable time of the terminal.

The present invention is adapted to the first and second power amplifiers contained in the multi-band terminal, whereby the usable time of the terminal can be increased without enhancing the circuit scale.

Even in the configuration wherein the power amplifiers different in the power source voltage performance depending on the to-be used band are used, since control is performed in accordance with the two end voltages, the battery can be effectively used.

Even when one of the radio bands is disabled for use during communication, the measure is taken to perform radio-band switching corresponding to the decrease in the battery voltage. This enables continual use of the terminal without causing communication to be discontinued.

BRIEF DESCRIPTION OF THE DRAWINGS

Embodiments of the present invention will be described in detail based on the following figures, wherein.

DETAILED DESCRIPTION OF THE PREFERRED EMBODIMENTS

Preferred embodiments of the present invention will be described in detail below.

Figure 1:
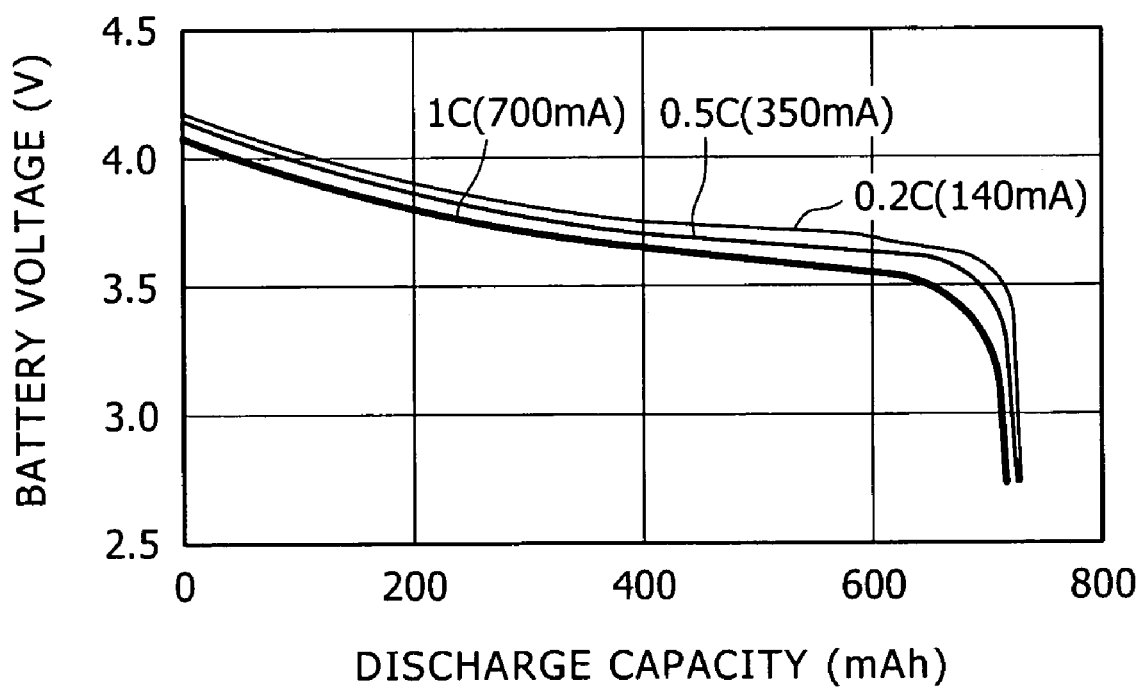
FIG. 1 is a graph showing example discharge load characteristics of a lithium ion secondary battery.
Figure 2:
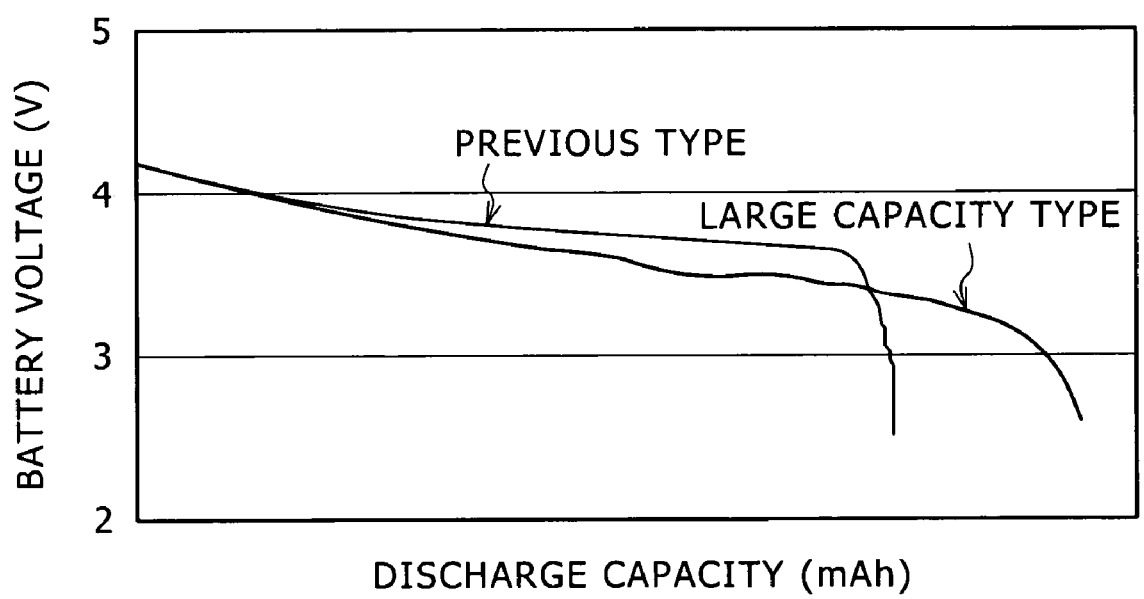
FIG. 2 is a graph showing example discharge load characteristics of a large-capacity battery.
Figure 3:
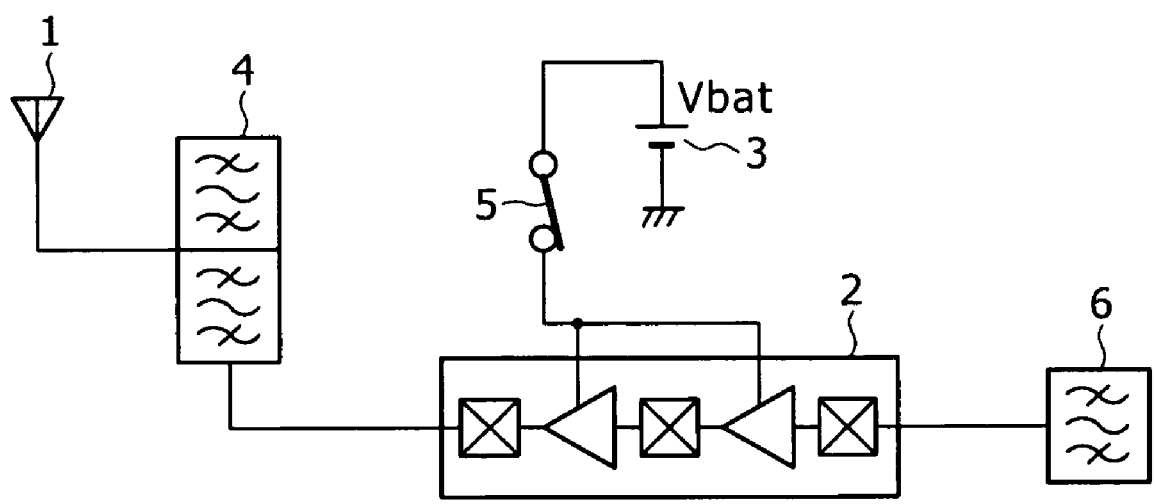
FIG. 3 is a block diagram showing an example configuration of a transmit section of a previous terminal.
Figure 4:
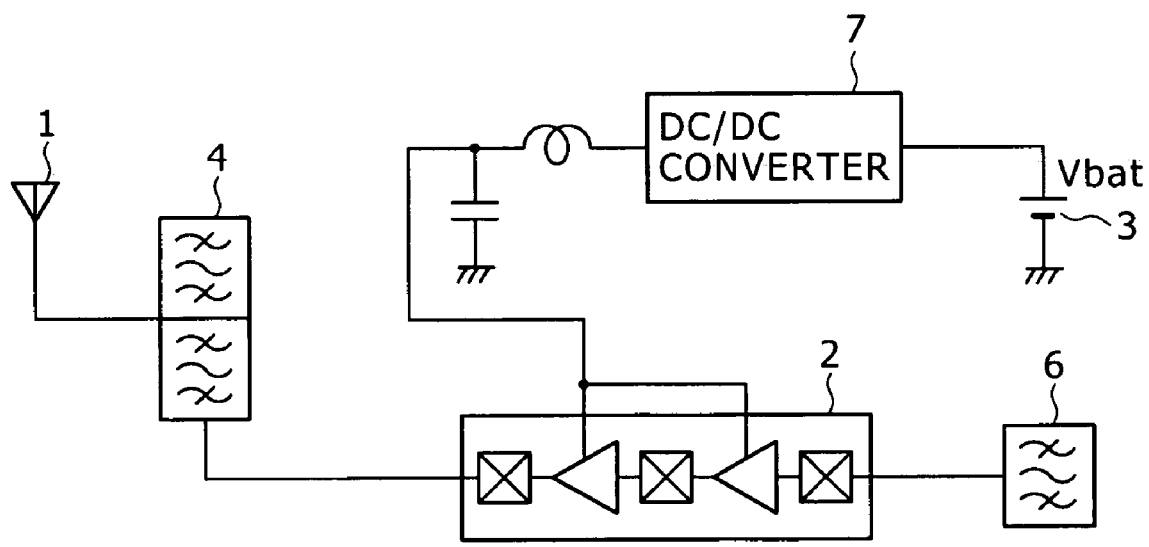
FIG. 4 is a block diagram showing an example configuration of a transmit section used in a CDMA terminal.
Figure 5:
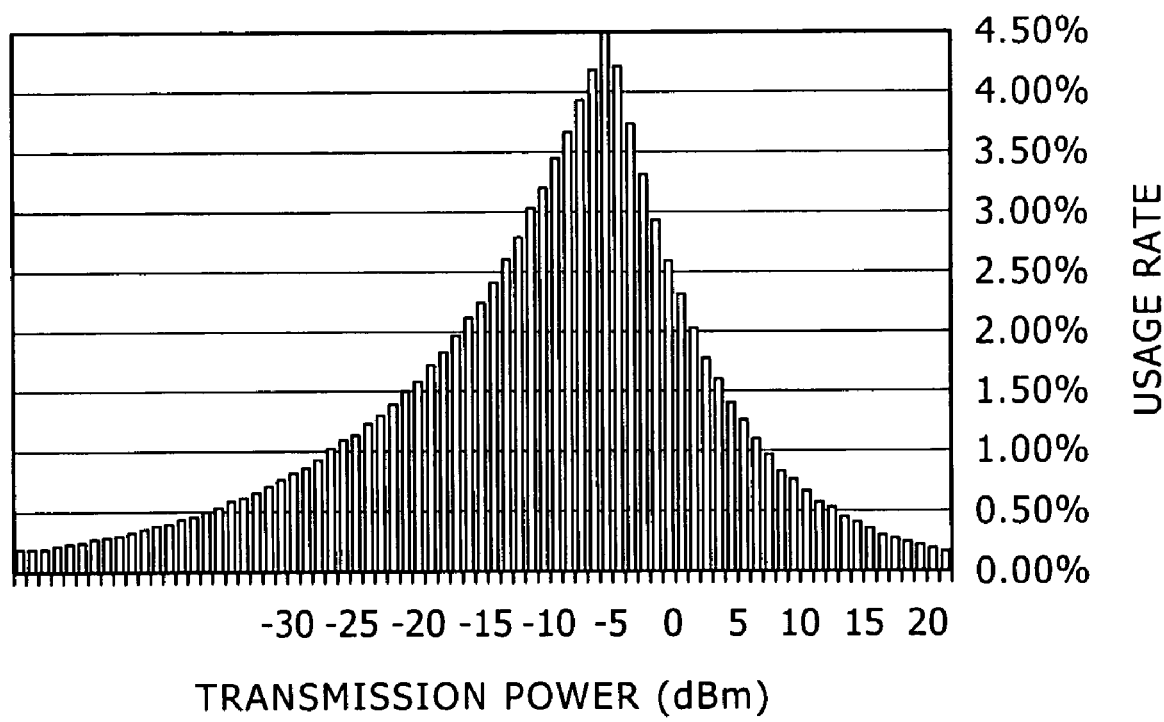
FIG. 5 is a graph showing output power distribution investigation results in an urban area.
Figure 6:
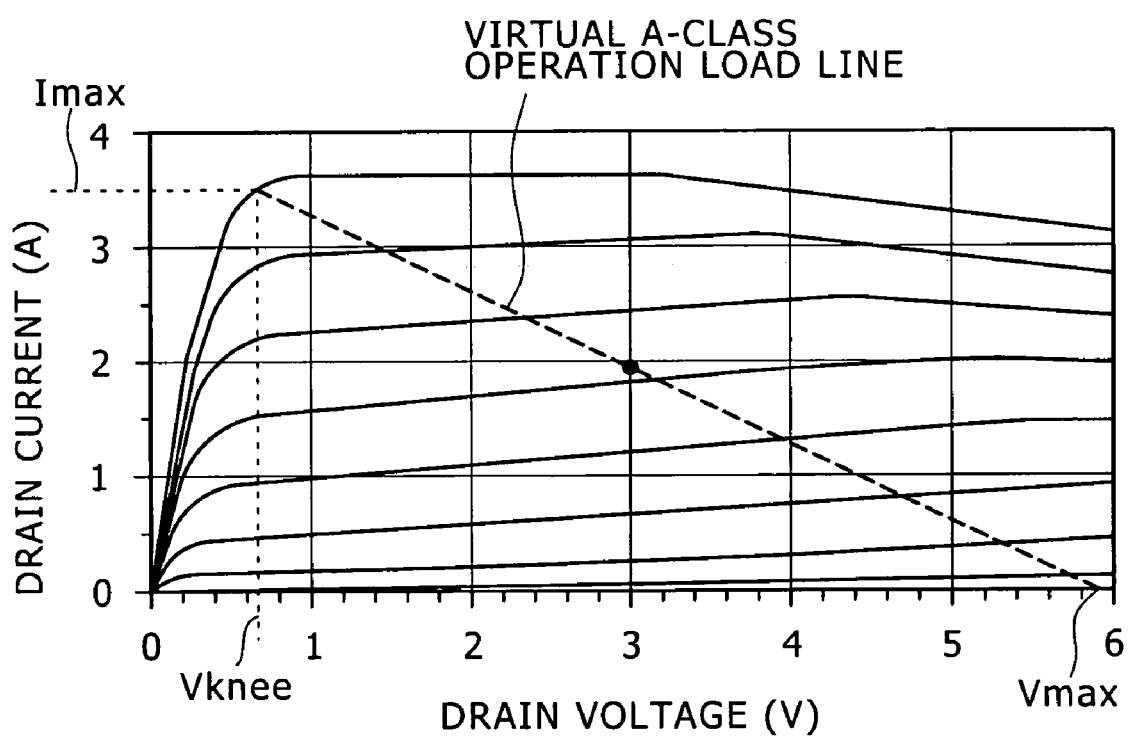
FIG. 6 is a graph descriptive of a virtual load line of a power amplifier.
Figure 7:
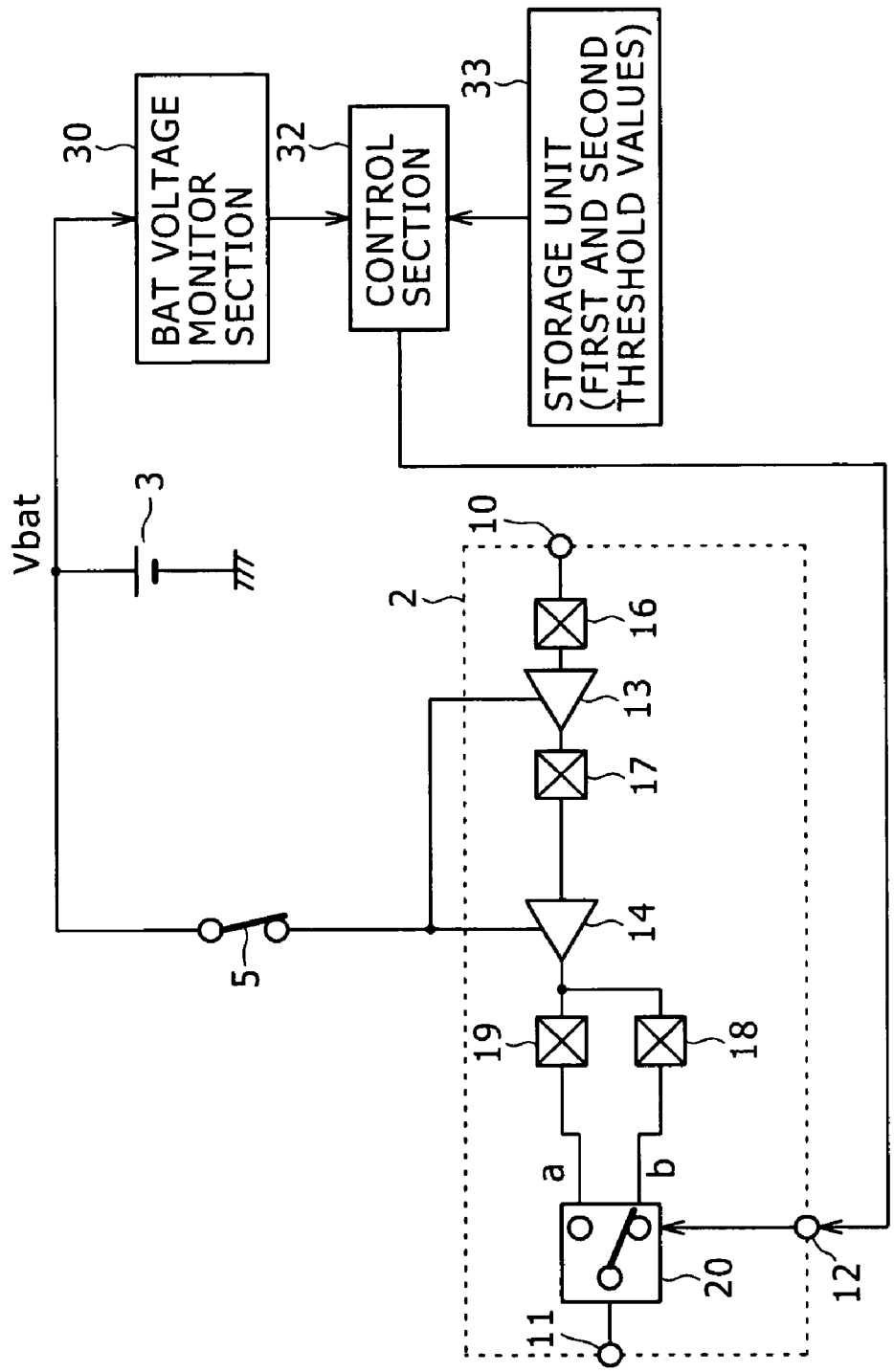
FIG. 7 is a block diagram of a communication terminal according to a first embodiment of the present invention.

FIG. 7 is a block diagram a communication terminal according to a first embodiment of the present invention.

A power amplifier 2 has a configuration including input terminal 10, an output terminal 11, a switch signal input terminal 12, first stage input matching circuit 16, a first stage amplifier section 13, an inter-stage matching circuit 17, a last stage amplifier section 14, a first last-stage output matching circuit 19, a second last-stage output matching circuit 18, and a matching switch section 20.

The first last-stage output matching circuit 19 is optimized to be capable of outputting a maximum transmission power with high efficiency in the vicinity of an average discharge voltage (Vl) of a battery. The second last-stage output matching circuit 18 is optimized to be capable of outputting a maximum transmission power with high efficiency under a relatively low power source voltage in the discharge voltage characteristics of the battery.

A battery voltage monitor section 30 (shown as "BAT voltage monitor section") monitors a battery voltage (Vbat) at all times. When the battery voltage has become greater than a first threshold value (substantially a first end voltage V2, but V2<V1) stored in a storage section 33, a control section 32 control a signal of the switch signal input terminal 12, and shifts a switch of the matching switch section 20 to the side of a terminal a (or, "side a," hereafter). Thereby, control is performed so that the last stage amplifier section 14 outputs power to the output terminal 11 through the first last-stage output matching circuit 19 and the matching switch section 20.

If the battery voltage has decreased to less or equal to the first threshold value stored in the storage section, then control section 32 controls the signal of the switch signal input terminal 12, and shifts the switch of the matching switch section 20 to the side of a terminal b (or, "side b," hereafter). Thereby, control is performed so that the last stage amplifier section 14 outputs the power to the output terminal 11 through the second last-stage output matching circuit 18 and the matching switch section 20.

If the battery voltage has decreased to less or equal to a second threshold value (substantially a second end voltage V3, but V3<V2) stored in storage section 33, the control section 32 sets the power source to OFF after a termination process, such as saving of necessary information into a non-volatile memory, thereby to enable the terminal to turn OFF the power source. A switch for turning OFF the power source of the terminal is a well-known type, so that the switch is not shown.

Figure 12:
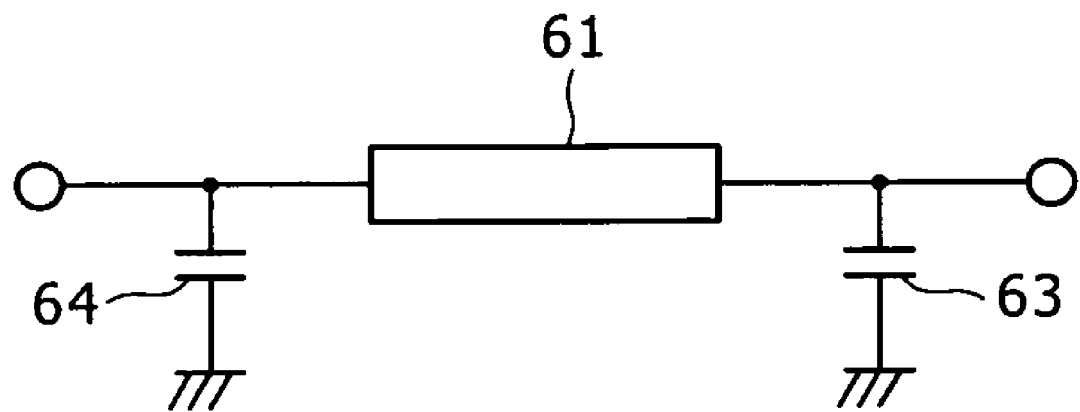
FIG. 12 is a circuit diagram shown an example configuration of a matching circuit in the configuration of FIG. 1, for example.

FIG. 12 shows an example configuration of the matching circuit. Generally, a matching circuit is configured of an assembly of passive components, such as a transmission line, a capacitor, and an inductor. FIG. 12 shows an example assembly of a transmission line 61, a capacitor 63, and capacitor 64 in order to reduce the line length of the transmission line.

Figure 13:
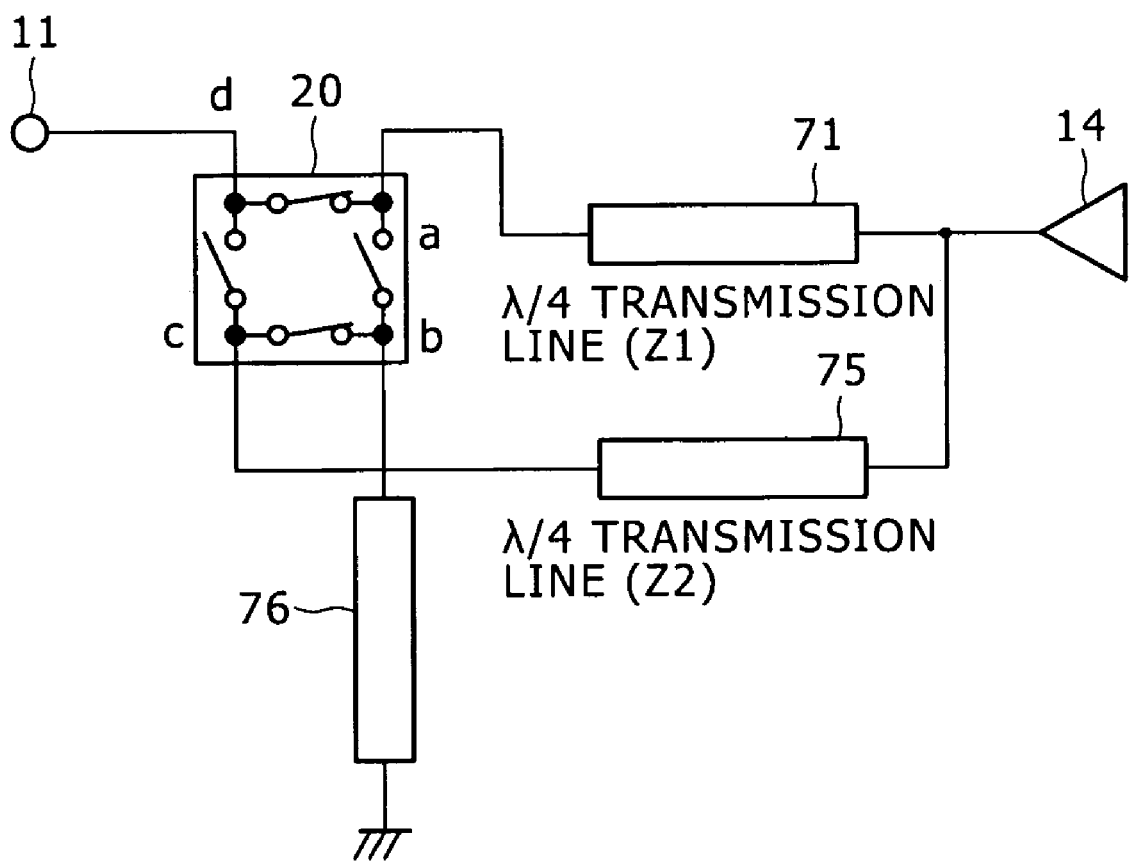
FIG. 13 is a view showing an example configuration of a switch section of the matching circuit in the configuration of FIG. 1, for example.

FIG. 13 is an example configuration of a switch section of the matching circuit. A DPDT (dual pole dual throw) switch is used for the matching switch section 20; and quarter wavelength (λ/4) transmission lines 71 and 75 are, respectively, used for the matching circuits 19 and 18. The DPDT switch performs an ON/OFF operation in conjunction with an inter-terminal a-d section and an inter-terminal b-c section, and performs an ON/OFF operation in conjunction with an inter-terminal a-b section and an inter-terminal c-d section. When the inter-terminal a-d section and the inter-terminal b-c section are ON, the inter-terminal a-b section and the inter-terminal c-d section turn OFF. On the other hand, when the inter-terminal a-d section and the inter-terminal b-c section are OFF, the inter-terminal a-b section and the inter-terminal c-d section turn ON. In addition, a terminal circuit 76 is provided. FIG. 13 shows a state where the output is supplied from the last stage amplifier section 14 through the transmission line 71, which is one of the transmission lines 71 and 75. Referring back to the configuration of FIG. 7, an SPDT (single pole dual throw) switch is used, and the end of an unused matching circuit is in an open state (OPEN), the impedance on the unused side of the transmission line 75 as viewed from the output of the last-stage amplifier section 14 is not sufficiently high. Consequently, a case can take place where a loss in the unused matching circuit provides influences. However, in the configuration of FIG. 13, as viewed from the output of the last stage amplifier section 14, the unused end of the matching circuit can be terminated with a predetermined (optimal) impedance of the terminal circuit 76 so that the impedance on the side of the matching circuit (transmission line 75 in the example shown in the drawing) is recognized to be high.

Figure 8:
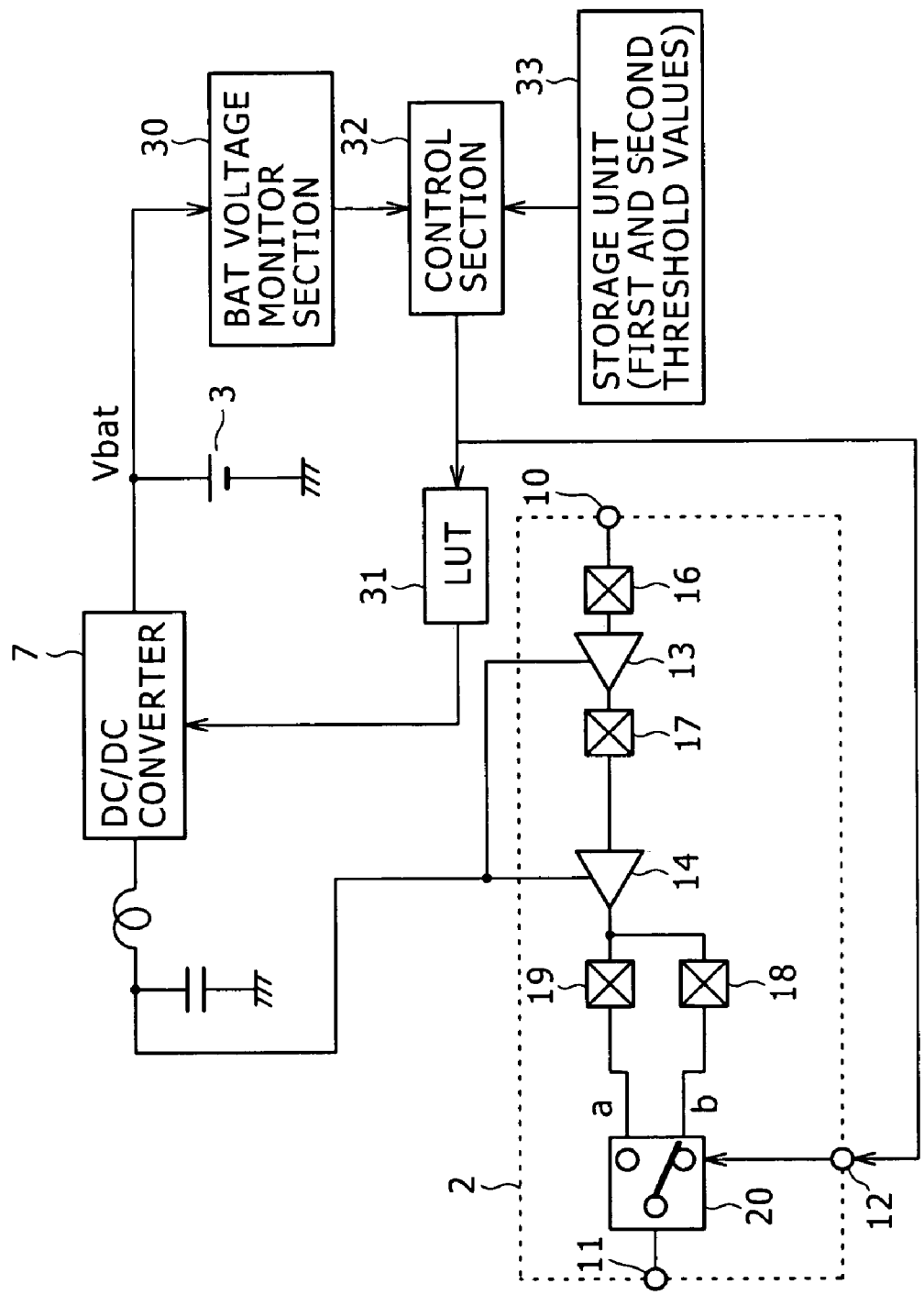
FIG. 8 is a block diagram of a communication terminal according to a second embodiment of the present invention.

FIG. 8 is a block diagram of a communication terminal according to a second embodiment of the present invention. The same reference characters identify the same components as those described in the first embodiment, and duplicated descriptions thereof will be omitted herefrom.

In the present embodiment, the configuration of the power amplifier 2 according to the first embodiment is adapted to a CDMA terminal, wherein the power source voltage for the power amplifier 2 is supplied from the battery 3 through the DC/DC converter 7. For supply of a power supply voltage corresponding to a transmission power terminal that is to be output from the terminal, the control section 32 makes lookup access to a lookup table 31 for control voltage (control voltage corresponding to the transmission power and a selected matching circuit), and performs control for the supply of the control voltage to the control terminal of the DC/DC converter 7.

Figure 14:
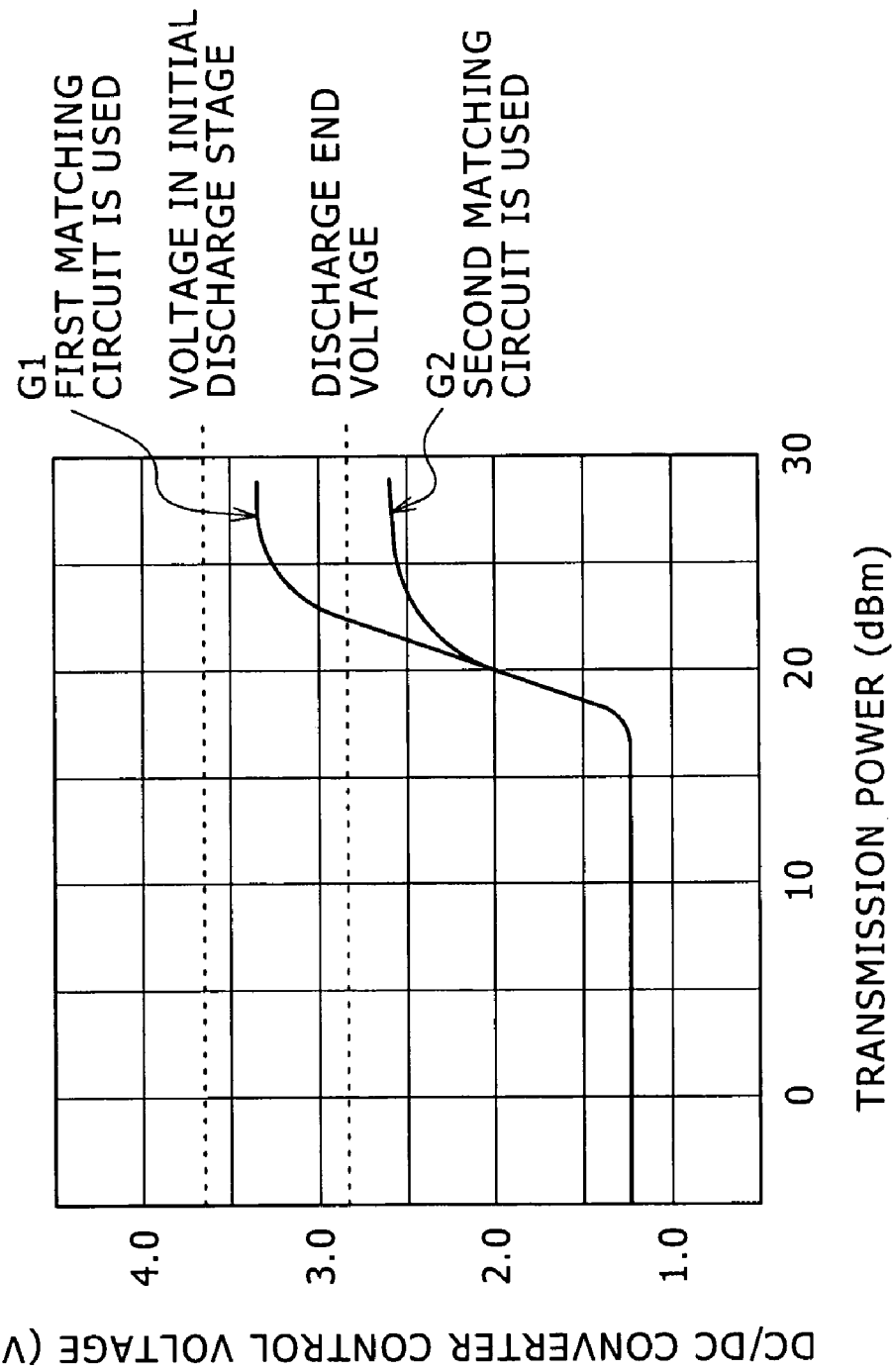
FIG. 14 is a graph showing an example configuration of a lookup table in a configuration shown in FIG. 9, for example.

FIG. 14 shows an example configuration of the lookup table 31, and more specifically, an example relationship between a transmission power and a control voltage (DC/DC converter output voltage) corresponding to a selected matching circuit. For the sake of simplification, there is shown an example case using a DC/DC converter that outputs a voltage identical to a control voltage. In this particular case, the table data are shown in the graph form. A waveform G1 in FIG. 14 represents table data that is used with the use of a first matching circuit, and a waveform G2 represents table data that is used with the use of a second matching circuit. Clearly in the graph, the two waveforms G1 and G2 match with one another with a relatively small voltage on the side where the transmission power is small. However, on the side where the transmission processing decreases, the waveforms G1 and G2 ramp up (abruptly rise) in the manner of branching away during rising. More specifically, in conjunction with the increase in the transmission power, the waveform G2 keeps rising even after the waveform G1 is saturated at a point near 2.6 V, and is saturated at a point near 3.3 V. Thus, to-be-used data stored in the lookup table 31 that determines the voltage for the supply to the control terminal of the DC/DC converter 7 can be switchably used depending on the matching circuit being used.

Figure 9:
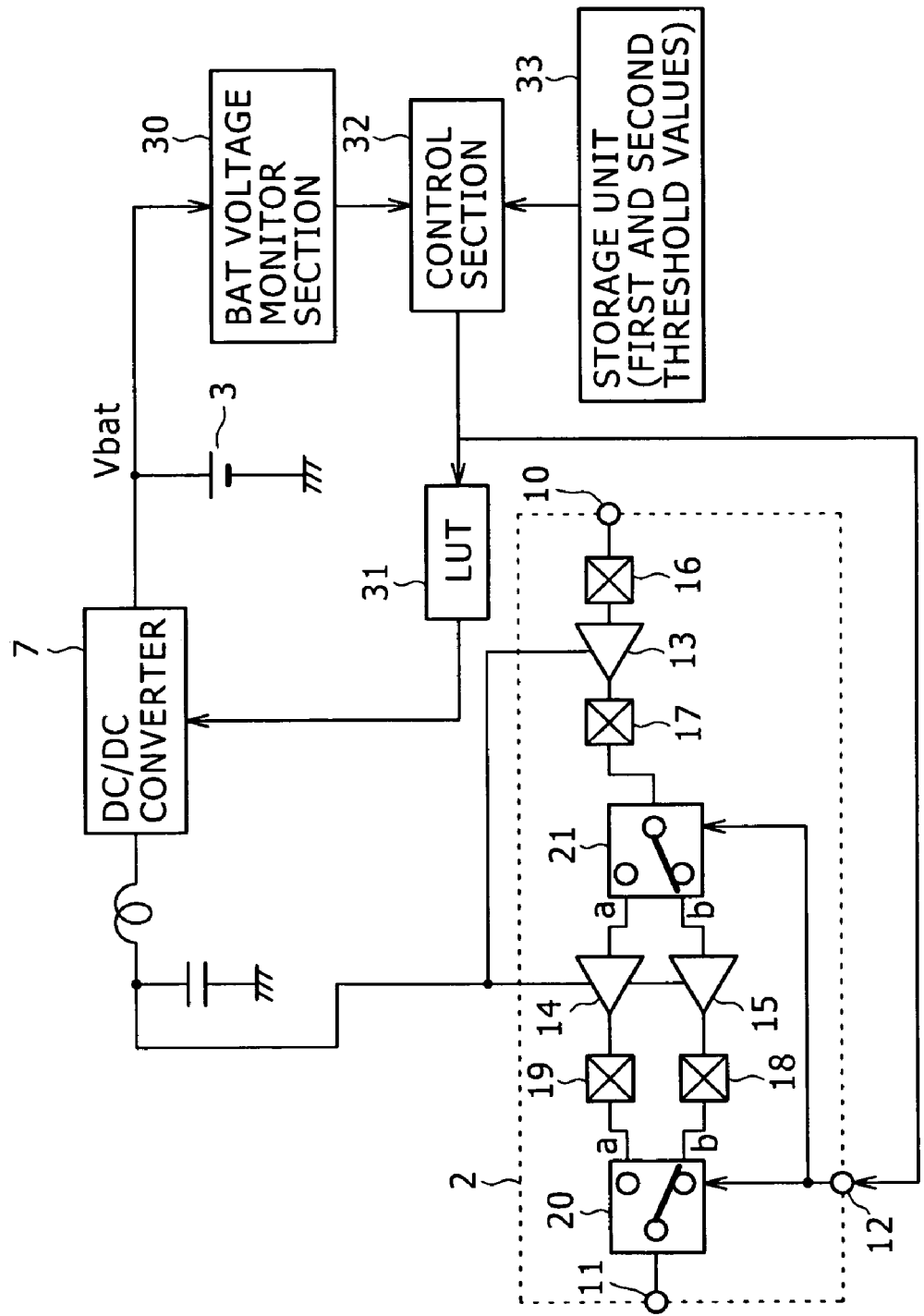
FIG. 9 is a block diagram of a communication terminal according to a third embodiment of the present invention.

FIG. 9 is a block diagram of a communication terminal according to a third embodiment of the present invention. The same reference characters identify the same components as those in the first and second embodiments described above, and duplicated descriptions thereof will be omitted herefrom.

In the configurations of FIGS. 7 and 8, switching is performed only to select the last-stage output matching corresponding to circuit. However, the configuration of FIG. 9 is designed to perform switching to additionally select the last stage amplifier section in a pair (set). In specific, in addition to the last stage amplifier section 14, a last stage amplifier section 15 is additionally provided. In this configuration, in comparison to the configuration of FIG. 7, although the number of elements is increased involving a cost increase, there are advantages in that the design of the matching circuits is easy, and a low loss (high efficiency) can be attained.

The battery voltage monitor section 30 monitors the battery voltage at all times. If the battery voltage has become greater than the first threshold value stored in the storage section 33, the control section 32 controls the signal of the switch signal input terminal 12 of the power amplifier 2, and shifts both the respective switches of the matching switch section 20 and the matching switch section 21 to the side a. Thereby, control is performed so that the last stage amplifier section 14 outputs the power to the output terminal 11 through the first last-stage output matching circuit 19 and the matching switch section 20. Although not shown, the bias of the last stage amplifier section 15 is concurrently set to OFF, thereby to cause the current to not flow to the last stage amplifier section 15.

If the battery voltage has decreased to less or equal to the first threshold value stored in the storage section 33, the control section 32 controls the signal of the switch signal input terminal, and shifts respective switches of the matching switch section 20 and the matching switch section 21 to the sides b. Thereby, control is performed so that the last stage amplifier section 15 outputs the power to the output terminal 11 through the second last-stage output matching circuit 18 and the matching switch section 20. Although not shown, the bias of the last stage amplifier section 14 is concurrently set to OFF, thereby to cause the current to not flow to the last stage amplifier section 14.

Figure 10:
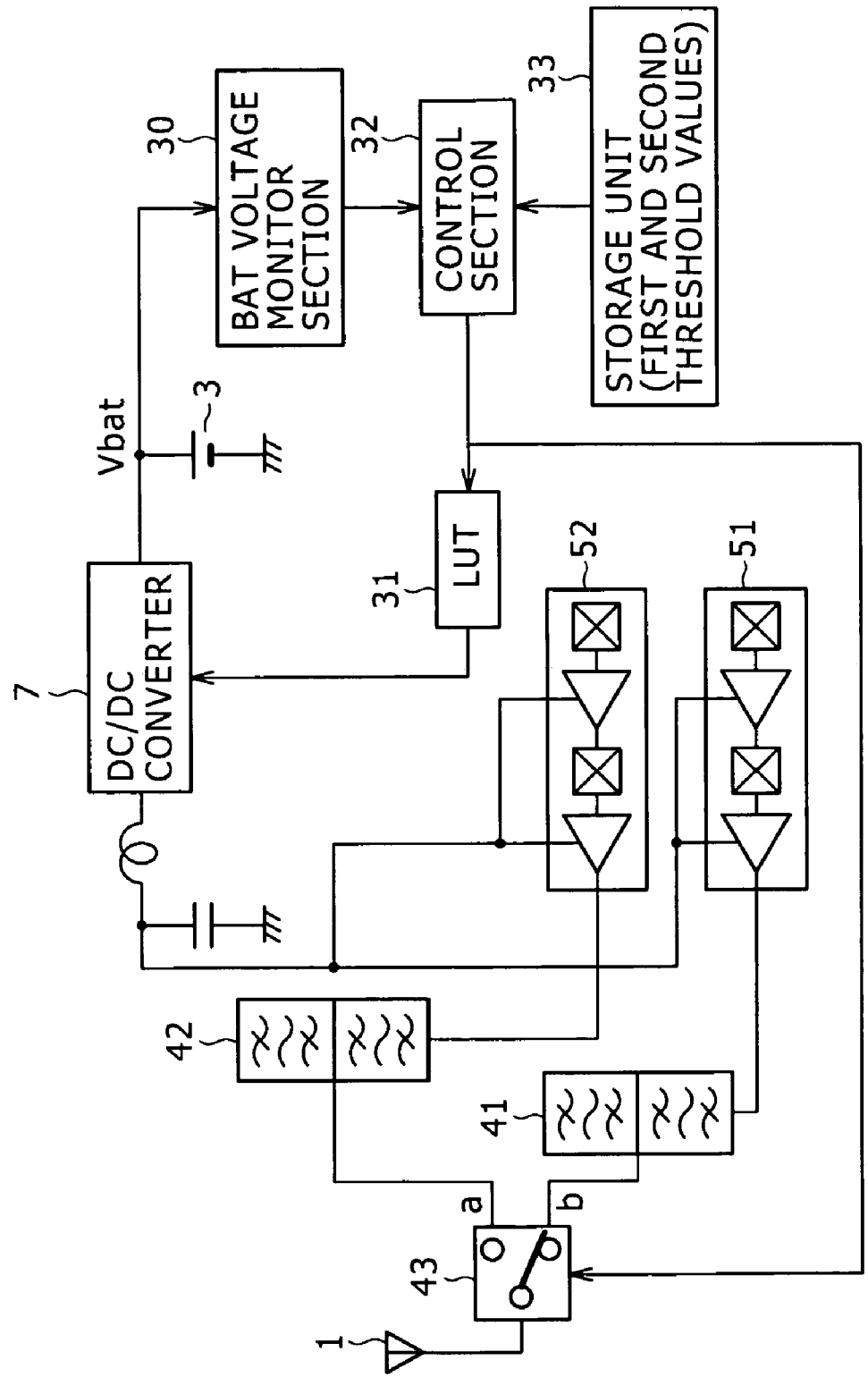
FIG. 10 is a block diagram of a communication terminal according to a fourth embodiment of the present invention.

FIG. 10 is a block diagram of a communication terminal according to a fourth embodiment of the present invention. The same reference characters identify the same components as those in the embodiments described above, and duplicated descriptions thereof will be omitted herefrom.

FIG. 10 is the case of adaptation to a transmit section corresponding to dual modes (or, multi-modes) using a plurality of radio bands A and B. The dual modes enable switchable use of communication systems different from one another. Dual modes enable switchable use of radio bands different from one another in a same system. Generally, in the dual modes, radio bands to be used in two modes are different from one another. In the radio band A, the first power amplifier 52 and the first duplexer 42 are used, whereas in the radio band B, the second power amplifier 51 and the second duplexer 41 are used. In correspondence to the radio band to be used, a switch 43 switches the connection of the antenna 1 to the transmission circuit.

The first power amplifier 52 is optimized to be capable of outputting a maximum transmission power with high efficiency in the vicinity of an average discharge voltage of the battery. The second power amplifier 51 is optimized to be capable of outputting a maximum transmission power with high efficiency under a relatively low power source voltage in the discharge voltage characteristics of the battery.

As described above, the battery voltage monitor section 30 monitors the battery voltage at all times. If the battery voltage has become greater than the first threshold value stored in the storage section 33, either the radio band A or the radio band B is usable, whereby the radio band can be selected corresponding to the location of the base station and/or the radio wave state. If the radio bands A and B are about the same in the radio wave state, the radio band A is used with precedence, thereby to make it possible to maximize the usable time of the terminal. For example, when selecting the radio band A, control is performed such that the switch 43 shifts to the side a, and the power amplifier 52 outputs the power to the antenna 1 through the duplexer 42 and the switch 43. Although not shown, the bias of the second power amplifier 51 is concurrently set to OFF, thereby to cause the current to not flow to the second power amplifier 51.

If the battery voltage has decreased to less or equal to the first threshold value stored in the storage section 33, the control section 32 shifts a switch 43 to the side b. Thereby, control is performed so that the power amplifier 51 outputs the power to the antenna 1 through the duplexer 41 and the switch 43. Although not shown, the bias of the power amplifier 52 is concurrently set to OFF, thereby to cause the current to not flow to the power amplifier 52.

If the battery voltage has become the second threshold value stored in the storage section 33, the control section 32 sets the power source to OFF after a termination process, such as saving of necessary information into a nonvolatile memory, thereby to enable the terminal to turn OFF the power source.

In addition, to supply to the power amplifier 2 the power supply voltage corresponding to the transmission power that is to be output by the terminal, the control section 32 makes lookup access to the lookup table 31 for a control voltage corresponding to the transmission power and the selected radio band, and supplies the voltage to the control terminal of the DC/DC converter 7.

Accordingly, if the battery voltage is less or equal to the first threshold value, and concurrently, is greater than the second threshold value, while the terminal cannot be used in the radio band A, the terminal can be used in the radio band B. As such, at a site where both the radio bands A and B can be used, the overall use time of the terminal can be increased. Consequently, the order of precedence of to-be used bands can be set to maximize the usable time of the terminal.

Figure 11:
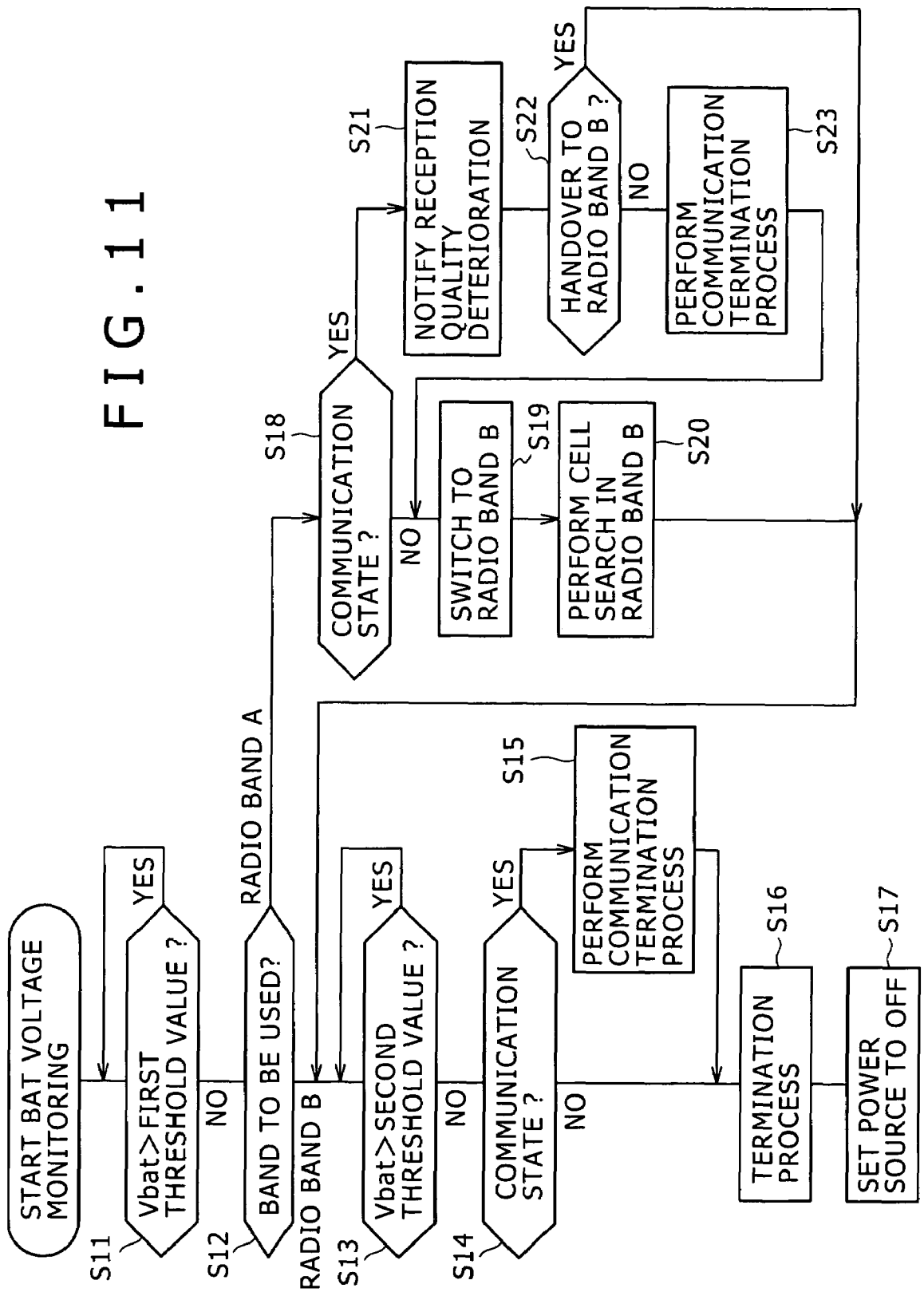
FIG. 11 is flow diagram showing an example execution flow in a dual band W-CDMA terminal according to the fourth embodiment.

FIG. 11 shows an example execution flow in a dual band W-CDMA (wide band CDMA) terminal.

In the event that a battery voltage Vbat has decreased to less or equal to the first threshold value (step S11: NO), if the terminal is using the radio band A (S12), and concurrently, the state is the communication state (Sl8: YES), then deterioration of reception quality (SIR, for example) is notified to the base station (S21). Characteristics, such as distortion characteristics and noise characteristics, of the power amplifier are predicted to deteriorate to a degree that influences both the transmission characteristics and reception characteristics. However, the terminal preliminarily has data of, for example, a predicted level of deterioration in reception performance due to the battery voltage decrease to less or equal to the first end voltage of the battery voltage. Accordingly, a predicted value (data) of the reception quality in the deteriorated state can be notified to the base station before the characteristics actually deteriorate to a degree that disables the communication state to be maintained. In accordance with the value thus notified, the base station determines whether to effect handover from the radio band A to the radio band B. If the handover from the base station A to the radio band B is requested (S22: YES), since the current communication is not discontinued, switching between the radio bands is effected by the switch 43 (FIG. 10) without feeling of inconveniences being imposed on the user. Concurrently, also to-be-used table data stored in the LUT 31 (FIG. 10) is altered. If no request for handover has been issued, a communication termination process (S23) is executed, and flow goes to step S19 described below.

If the battery voltage decrease to less or equal to the first threshold value has occurred not in the communication state (S18, No), the terminal itself is able to effect the radio band switching, not in accordance with the request from the base station (S19). After having switched to the radio band B, cell search is performed in the radio band B (S20), and flow then proceeds to step S13.

At step S12 if the to-be used band is the radio band B, the radio band B is continually used until the battery voltage decreases to less or equal to the second threshold value.

At step S13 in the event that the battery voltage has decreased to the second threshold value, if the state is in the communication state (S14: YES), a communication termination process is executed (S15). Then a termination process is performed (S16), and the power source is set to OFF (S17). If at step S14 the state is not in the communication state, flow simply proceeds to step S16.

According to the present embodiment, the present invention is adapted to the two power amplifiers inherently contained in the dual band terminal, whereby the usable time of the terminal can be increased without enhancing the circuit scale. In addition, although the power amplifiers different in the power source voltage performance in units of the to-be-used band are used, since control is performed in accordance with the two threshold values, the battery can be effectively used.

As above, while the preferred embodiments of the present invention have been described, various modifications and alterations in addition to the above may be made without departing the spirit and scope of the invention.

What is claimed is:

1. A radio communication terminal to be operated by a battery, the terminal comprising:
    a voltage monitor section that monitors a battery voltage;
    a power amplifier that outputs a desired power;
    a plurality of matching circuits that are disposed in a rear stage of the power amplifier and that optimize an efficiency of the power amplifier for a range of different battery voltages;
    a switch for performing selection between the plurality of matching circuits; and
    a control section that makes comparison between a threshold value predetermined for switching between the plurality of matching circuits and a battery voltage detected by the voltage monitor section and that performs control of switching between the plurality of matching circuits.

2. A radio communication terminal according to claim 1, wherein the plurality of matching circuits includes:
    a first matching circuit that optimizes the efficiency of the power amplifier for a battery voltage higher than the threshold value;
    a second matching circuit that optimizes the efficiency of the power amplifier at a voltage lower than the threshold value.

3. A radio communication terminal according to claim 2, wherein
    the power amplifier includes a first power amplifier and a second power amplifier that correspond to the first matching circuit and the second matching circuit, respectively; and
    the switch performs switching between a set of the first amplifier and the first matching circuit and a set of the second amplifier and the second matching circuit.

4. A radio communication terminal according to claim 1, further comprising:
    a DC (direct current)/DC (direct current) converter that converts the battery voltage to a power supply voltage that is to be applied to the power amplifier, in accordance with a control signal; and
    a data table for generating control signals of the DC/DC converter in accordance with outputs of the voltage monitor section.

5. A radio communication terminal according to claim 1, wherein
    when the battery voltage is lower than another threshold value that is lower than the threshold value, the control section sets a power source to OFF.

6. A radio communication terminal according to claim 1, further comprising a terminal circuit that terminates unused one of the plurality of matching circuits at a predetermined impedance.

7. A radio communication terminal that is operated by a battery and that is operable in multiple bands (multi-bands), the terminal comprising:
    a voltage monitor section that monitors a battery voltage;
    a first power amplifier and a second power amplifier that correspond to a first radio band and a second radio band, respectively;
    a switch that selects one of the power amplifier corresponding to a desired one of the radio bands for supply of power to an antenna; and
    a control section that makes a comparison between a threshold value predetermined and the battery voltage, and performs control of the switch in accordance with a result of the comparison,
    wherein the control section performs control so that the second power amplifier is selected when the battery voltage decreases below the threshold value.

8. A radio communication terminal according to claim 7, wherein
    the first power amplifier is optimized to be capable of outputting a maximum transmission power with high efficiency under a relatively high power source voltage in discharge voltage characteristics of the battery; and
    the second power amplifier is optimized to be capable of outputting the maximum transmission power with high efficiency under a relatively low power source voltage in the discharge voltage characteristics of the battery.

9. A radio communication terminal according to claim 7, wherein
    the control section performs a process of setting a power source to OFF when the battery voltage decreases below another threshold value predetermined to be lower than the threshold value.

10. A radio communication terminal according to claim 7, wherein
    in an event that the battery voltage decreases below the threshold value, when the terminal is in a communication state,
    a predicted deterioration in reception quality in the radio band corresponding to the communication is reported to a base station before operation of the the radio band is terminated.

11. A radio communication terminal according to claim 10, wherein upon reception of a request from the base station, the control section performs switching to select to-be-used one of the radio bands and a corresponding one of the power amplifiers without causing discontinuation of communication.

12. A radio communication terminal according to claim 7, further comprising:
    a DC (direct current)/DC (direct current) converter that converts the battery voltage to a power supply voltage that is to be applied to the power amplifier, in accordance with a control signal; and
    a data table for generating control signals of the DC/DC converter in accordance with outputs of the voltage monitor section.

* * * * *